(12) United States Patent
Zhang et al.

(10) Patent No.: US 6,689,651 B2
(45) Date of Patent: Feb. 10, 2004

(54) LASER PROCESSING METHOD

(75) Inventors: Hongyong Zhang, Yamato (JP); Koichiro Tanaka, Atsugi (JP)

(73) Assignee: Semiconductor Energy Laboratory Co., Ltd., Kanagawa (JP)

( * ) Notice: Subject to any disclaimer, the term of this patent is extended or adjusted under 35 U.S.C. 154(b) by 0 days.

(21) Appl. No.: 09/946,381

(22) Filed: Sep. 6, 2001

(65) Prior Publication Data

US 2002/0009839 A1 Jan. 24, 2002

Related U.S. Application Data

(62) Division of application No. 08/504,087, filed on Jul. 19, 1995, now Pat. No. 6,300,176.

(30) Foreign Application Priority Data

Jul. 22, 1994 (JP) ............................................. 6-191984

(51) Int. Cl.⁷ .......................................... H01L 21/268
(52) U.S. Cl. ..................................................... 438/166
(58) Field of Search ............................... 438/166, 487, 438/798; 117/4, 3, 8, 10, 200, 204, 902, 930

(56) References Cited

U.S. PATENT DOCUMENTS

| | | | | |
|---|---|---|---|---|
| 4,463,028 A | * | 7/1984 | Laude | 427/53.1 |
| 4,466,179 A | | 8/1984 | Kasten | |
| 4,469,551 A | | 9/1984 | Laudac | |
| 4,940,636 A | | 7/1990 | Brock et al. | |
| 5,232,674 A | | 8/1993 | Mukai et al. | |
| 5,352,291 A | * | 10/1994 | Zhang et al. | 117/8 |
| 5,365,875 A | | 11/1994 | Asai et al. | |
| 5,366,926 A | | 11/1994 | Mei et al. | |
| 5,372,836 A | | 12/1994 | Imahashi et al. | |
| 5,413,958 A | * | 5/1995 | Imahashi et al. | 438/166 |
| 5,436,195 A | * | 7/1995 | Kimura et al. | 438/166 |
| 5,473,412 A | | 12/1995 | Ozawa | |
| 5,529,951 A | | 6/1996 | Noguchi et al. | |
| 5,561,051 A | | 10/1996 | Silverman | |
| 5,561,081 A | * | 10/1996 | Takenouchi et al. | |
| 5,756,364 A | | 5/1998 | Tanaka et al. | |
| 5,795,795 A | | 8/1998 | Kousai et al. | |
| 5,803,965 A | * | 9/1998 | Yoon | 117/4 |
| 5,804,471 A | * | 9/1998 | Yamazaki et al. | |
| 5,869,362 A | * | 2/1999 | Ohtani | 438/166 |
| 5,897,799 A | * | 4/1999 | Yamazaki et al. | |
| 5,968,383 A | * | 10/1999 | Yamazaki et al. | |
| 6,174,374 B1 | | 1/2001 | Zhang et al. | |
| 6,176,922 B1 | * | 1/2001 | Aklufi et al. | 117/4 |
| 6,329,229 B1 | * | 12/2001 | Yamazaki et al. | 438/166 |
| 6,440,785 B1 | * | 8/2002 | Yamazaki et al. | 438/164 |

FOREIGN PATENT DOCUMENTS

JP 03-025920 2/1991

OTHER PUBLICATIONS

A.M. Zhivov, Variable–Air–Volume Ventilation systems for Industrial Buildings, p. 367–372.
CHEMFAB Beles Brochure, Chemfab Corporation.
Thow, Japan J. Appl. Phys. vol. 33, 1994.
Part 2, No. 10, 150CT 1994, L438–441.

* cited by examiner

*Primary Examiner*—Savitri Mulpuri
(74) *Attorney, Agent, or Firm*—Eric J. Robinson; Robinson Intellectual Property Law Office, P.C.

(57) ABSTRACT

In an annealing process of illuminating a semiconductor thin film with laser light, in the case where the laser illumination is performed at an energy level that is lower than an output energy range that allows a laser apparatus to operate most stably, the laser output is fixed somewhere in the above output energy range and the illumination energy is changed by inserting or removing a light attenuation filter into or from the laser illumination optical path. As a result, the time required for the laser processing can be shortened.

24 Claims, 4 Drawing Sheets

LASER PROCESSING METHOD

BACKGROUND OF THE INVENTION

1. Field of the Invention

The present invention relates to a semiconductor device manufacturing method using laser light illumination which method is superior in mass-productivity and can provide small variations and a high yield, and to a laser processing apparatus usable in such a method. In particular, the invention relates to a method and an apparatus for improving or recovering the crystallinity of a semiconductor material part or all of which is made of an amorphous component, a substantially intrinsic polycrystalline semiconductor material, or a semiconductor material which crystallinity has been greatly degraded due to irradiation of ions, ion implantation, ion doping, or the like, by illuminating such a semiconductor material with laser light.

2. Description of the Prior Art

In recent years, extensive studies have been made to lower the temperature of semiconductor manufacturing processes. This is due to the need of forming semiconductor devices on an insulative substrate, such as a glass substrate, that is not highly heat resistant, as well as to miniaturization and multi-layering of devices.

In semiconductor processes, it is sometimes necessary to crystallize an amorphous component included in a semiconductor material or an amorphous semiconductor material, cause a semiconductor material to restore its crystallinity that has been degraded due to irradiation with ions, or improve the crystallinity of a crystalline semiconductor material.

Conventionally, thermal annealing is used for such purposes. When silicon is used as a semiconductor material, crystallization of an amorphous material, recovering and improvement of the crystallinity, and the like are performed by annealing of 0.1 to 48 hours or longer at 600 to 1,100° C.

In general, as the temperature is increased, the thermal annealing can be performed in a shorter period and becomes more effective. At a temperature lower than 500° C., the thermal annealing causes almost no effects. Therefore, from the viewpoint of lowering the process temperature, it is necessary to replace a conventional manufacturing step involving thermal annealing with a step using some other means.

An annealing technique using laser light illumination now attracts much attention as an ultimate low-temperature process to replace the thermal annealing. This is because laser light can be applied only to a portion that requires high energy equivalent to that of the thermal annealing and, therefore, it is not necessary to expose the entire substrate to a high-temperature environment.

Generally, there have been proposed two methods of laser light illumination. In the first method, a CW laser such as an argon ion laser is used to apply a spot-like beam to a semiconductor material. After being melted, the semiconductor material is gradually solidified and thereby crystallized due to an uneven energy profile of the beam and movement of the beam.

In the second method, a pulsed laser such as an excimer laser is used to apply a high-energy laser pulse to a semiconductor material. The semiconductor material is crystallized by instantaneously melting and then solidifying it.

SUMMARY OF THE INVENTION

The first method has a problem of long processing time. This is because a CW laser, whose maximum output energy is not high, can produce a beam spot diameter of several millimeters at the widest. In contrast, the second method, in which the maximum output energy of a laser is very high, can produce a large spot of more than several square centimeters (in general, the beam pattern is square or rectangular), to provide high mass-productivity.

However, where a usual square or rectangular beam is used to process a single, large-area substrate, it needs to be moved in all the four directions. This point still remains to be improved.

This can be greatly improved by deforming the beam into a linear shape, making its longitudinal dimension longer than the width of a substrate to be processed, and scanning the substrate with the beam, leaving, as an item to be improved, nonuniformity of laser illumination effects.

A pulsed laser has a feature that the output energy somewhat varies between pulses. Further, the degree of the output energy variation depends on the output energy level. Therefore, when illumination is performed in an energy range where stable laser oscillation is hard to establish, it is particularly difficult to perform laser processing with uniform energy over the entire substrate surface.

An object of the present invention is to solve the problem of nonuniformity. As for a method of reducing the above-described nonuniformity, it has been reported that the uniformity is improved by performing, before illumination with strong pulsed laser light, preliminary illumination with pulsed laser light that is weaker than the strong pulsed laser light. Further, it is known that the uniformity of the substrate surface is improved by making the scanning directions, with respect to the substrate, of the preliminary illumination and the main illumination approximately perpendicular to each other because nonuniform characteristics of the two illuminating operations cancel out each other. However, even this illumination method does not address the uniformity that is caused by a temporal variation of the laser energy.

In the above method in which the same substrate is illuminated with laser beams of different energy levels, the output energy needs to be changed before each of the second and following illuminating operations. Since the output of a pulsed laser is unstable for a while after the laser output is changed, the illumination should be suspended until the laser output becomes stable. As such, while plural times of laser illumination has an advantage of improving the uniformity of the substrate surface, it has a disadvantage of greatly increasing the processing time. Another object of the invention is to solve this problem.

In the laser crystallization, the magnitude of the laser energy has large influences on the characteristics of produced semiconductor devices. Therefore, in a laser crystallization process, the optimization of laser energy is one of the most important subjects. However, the stability of the output energy of pulsed laser light tends to be greatly reduced when the laser output energy is too low. Therefore, if a desired energy level is located in a range where the laser oscillation is unstable, the uniformity of the laser illumination surface will be very bad. Another object of the invention is to solve this problem.

According to the invention, the above-described problems are solved by using a light attenuation filter. More specifically, a laser is caused to produce such output energy that the laser can operate as stably as possible, and at least one light attenuation filter is used, to thereby perform laser illumination with the laser output energy adjusted at the optimum level. The method of the invention is particularly effective in the preliminary illumination that is performed at a low energy. It goes without saying that a light attenuation filter need not to be used where the optimum energy can be produced stably without using it.

The invention is more effective if it is practiced in a method in which the same substrate is subjected to plural times of laser illumination and the laser energy is changed in every illuminating operation (for example, the above-described method in which the two illuminating operations (preliminary and main) are performed). In the conventional method, the laser output needs to be changed because the preliminary and main illuminating operations should be performed at different energy levels. However, this makes the laser output unstable, and certain time is required for the laser output to become stable. Therefore, each of the second and following illuminating operations needs to be suspended until the laser output becomes stable. The invention can eliminate this waiting time. That is, by changing the light energy only by using the light attenuation filter, i.e., without changing the laser output, plural laser illuminating operations can be performed with the laser output kept stable. Thus, there is not required time for stabilizing the laser output.

The above method of performing plural laser illuminating operations can be practiced very efficiently by reciprocating a laser beam relative to the substrate. That is, the time required for the laser illumination can further be saved. In this method, the light attenuation filter may be used such that it is quickly inserted into or removed from the laser light optical path upon completion of the go or return movement of the laser beam illumination.

The advantages of the above-described constitution are not limited to the energy adjustment by mere combination of the laser and the light attenuation filter, but include that the laser illumination can be performed stably at an arbitrary energy level that is lower than the minimum energy level that can be obtained stably by a pulsed laser, and that the laser illumination can be performed continuously without changing the laser output in the above-described method of performing plural times of laser illumination at different energy levels.

DETAILED DESCRIPTION OF THE PREFERRED EMBODIMENTS

Embodiment 1

There is a tendency that the uniformity of the surface of an amorphous or crystalline silicon or silicon compound film is reduced in a process of increasing the crystallinity of such a film by applying laser light to it. The first embodiment is directed to a method of minimizing such reduction of uniformity. It will also be shown that the method of this embodiment can greatly shorten the working time of the laser illumination.

Figure 1:
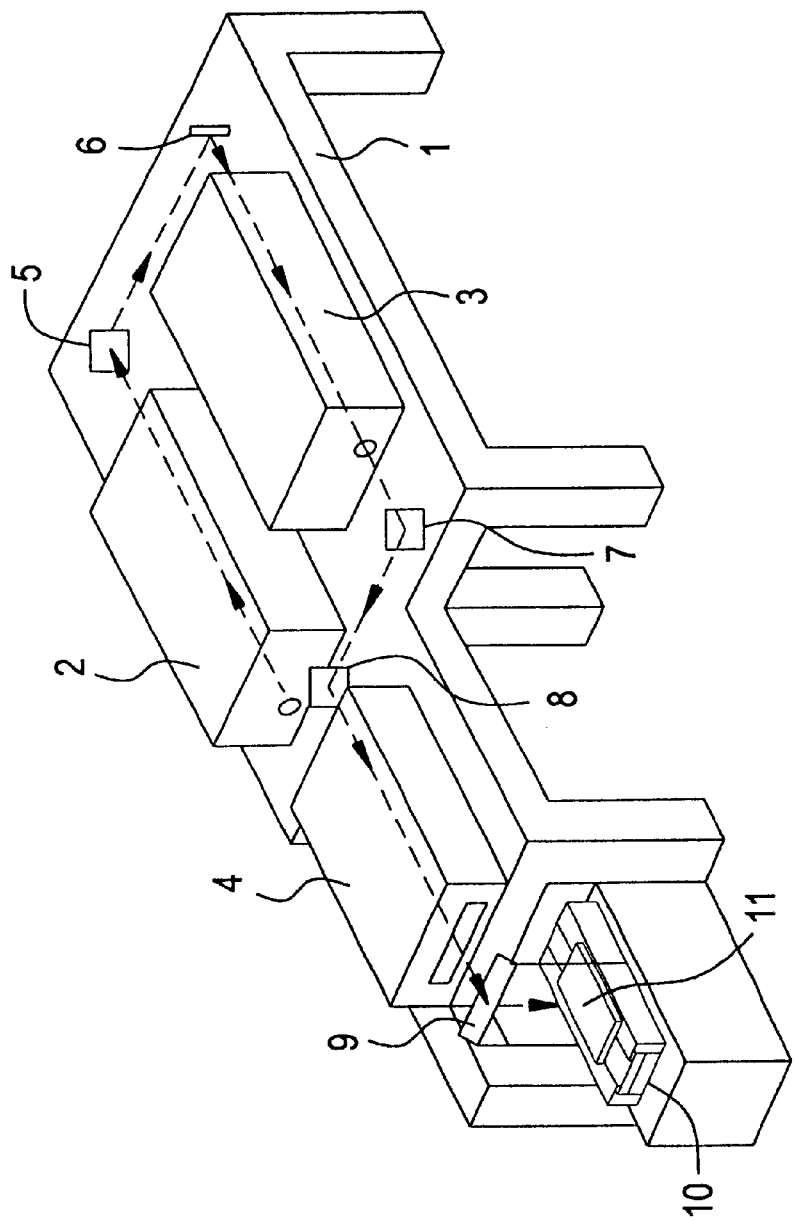
FIG. 1 shows the concept of a laser illumination apparatus.

First, a description will be made of an apparatus. FIG. 1 shows the concept of a laser annealing apparatus used in the first embodiment. An oscillator 2 for emitting laser light is mounted on a base 1. Full-reflection mirrors 5 and 6 are arranged on the optical path on the light emitting side of the oscillator 2. An amplifier 3, full-reflection mirrors 7 and 8, an optics 4, and a full-reflection mirror 9 are arranged in this order on the optical path on the reflection side of the full-reflection mirror 6. A sample 11 that is fixed on a sample stage and driving device 10 is placed on the optical path that is bent downward by the full-reflection mirror 9.

The oscillator 2 is a KrF excimer laser (wavelength: 248 nm; pulse width: 25 ns). It is apparent that other excimer lasers or other types of lasers can also be used.

Figure 3:
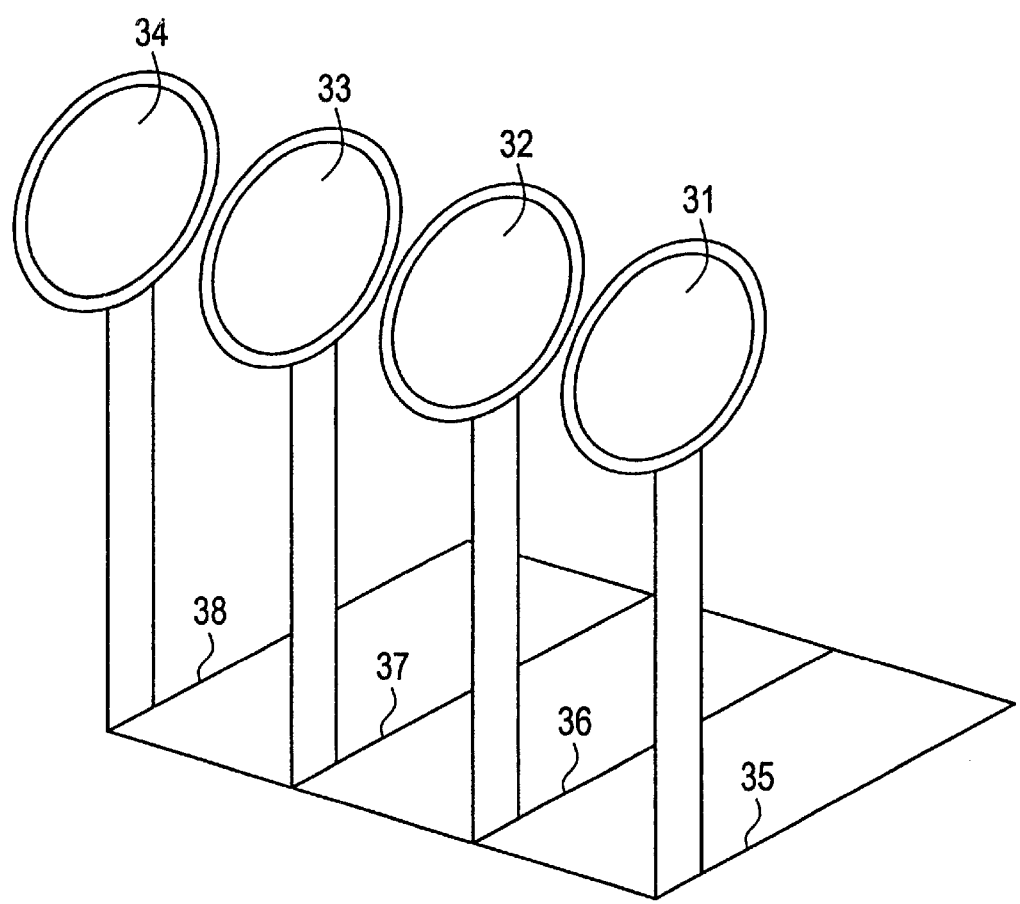
FIG. 3 shows the general configuration of a mechanism for inserting and removing filters.

Laser light emitted from the oscillator 2 is reflected by the full-reflection mirrors 5 and 6, amplified by the amplifier 3, and then introduced into the optics 4 via the full-reflection mirrors 7 and 8, Although not shown in FIG. 1, a mechanism for inserting light attenuation filters into and from the optical path is provided between the full reflection mirror 8 and the optics 4, and thus between the oscillator 2 and the optics 4. FIG. 3 shows the configuration of this mechanism. In FIG. 3, reference numerals 31 to 34 denote light attenuation filters having difference transmittances. By properly combining the four light attenuation filters 31 to 34, 15 kinds of transmittances can be obtained. In this embodiment, the light attenuation filters have transmittances of 96%, 92%, 85% and 77%. For example, a transmittance of 88% can be obtained by combining the filters of 96% and 92%.

Lines 35 to 38 represent rails. The mechanism is so designed that the light attenuation filters 31 to 34 can be moved along the respective rails 35 to 38 by remote control. The laser light, which has a rectangular shape of about 3×2 $cm^2$ before entering the optics 4, is reshaped by the optics 4 into a long and narrow beam (linear beam) having a length of 10 to 30 cm and a width of 0.1 to 1 cm. After being output from the optics 4, the laser light has the maximum energy of 1,000 mJ/shot.

The laser light is reshaped into such a long and narrow beam to improve its working ability, as described below. After being output from the optics 4, the linear beam is applied to the sample 11 via the full-reflection mirror 9. Since the beam is longer than the width of the sample 11, the entire sample 11 can be illuminated with the laser light by moving the sample 11 only in one direction. Therefore, the sample stage and driving device 10 has a simple structure and can be maintained easily. Further, the alignment operation in setting the sample 11 can be readily performed.

The sample stage 10 to which the laser light is applied is controlled by a computer, and is so designed as to move perpendicularly to the linear laser light. Further, if the sample stage 10 is provided with a function of rotating a table for receiving a substrate within the table plane, the laser beam scanning direction can be changed conveniently in the case of performing plural times of laser illumination on the same substrate. A heater is incorporated below the stage 10 to keep the sample 11 at a prescribed temperature during the laser light illumination.

Figure 2:
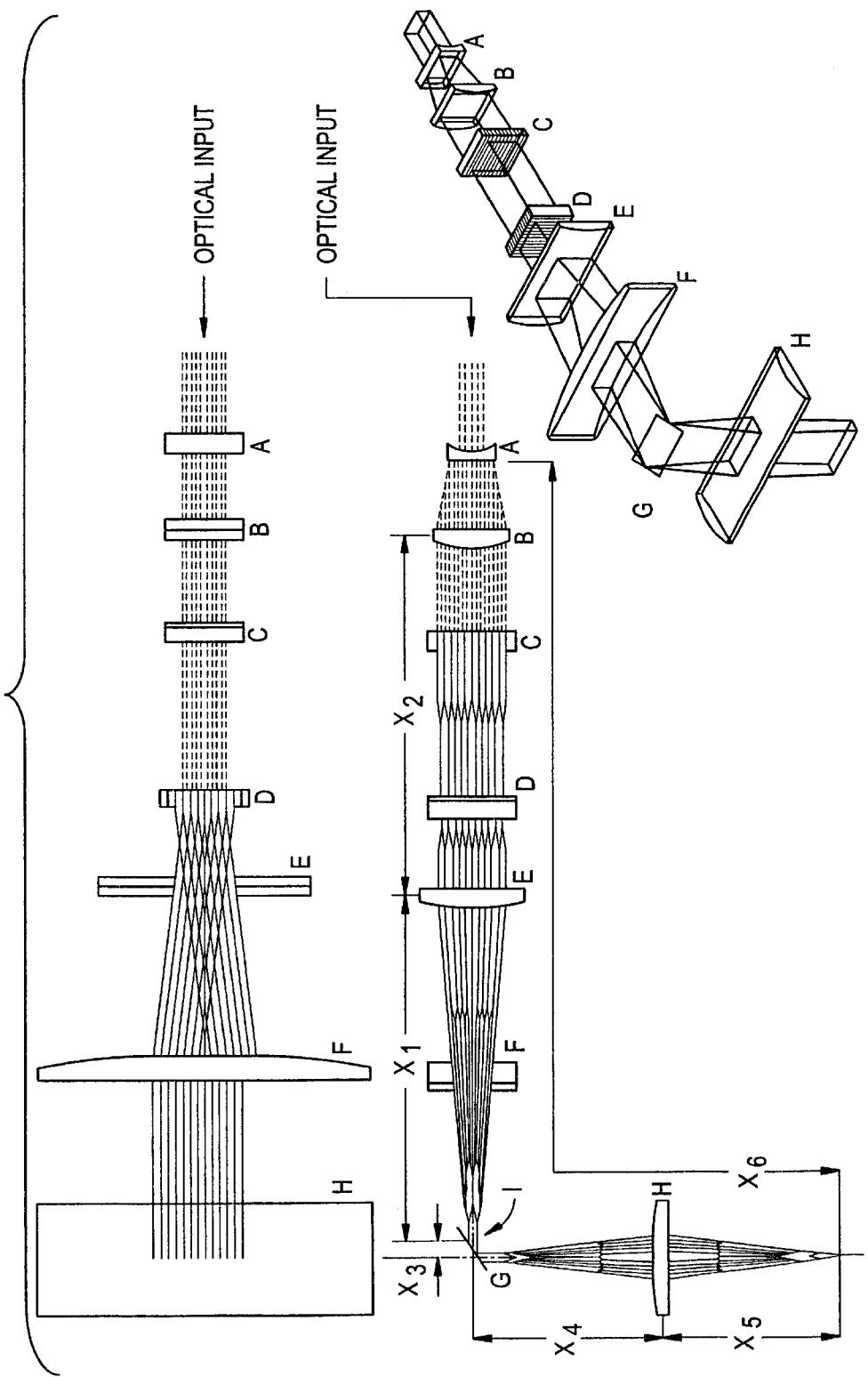
FIG. 2 shows the general configuration of an optics for reshaping laser light.

FIG. 2 shows the optical path inside the optics 4, which function as a homogenizer. In the optics 4, the profile of the laser light is changed from a Gaussian distribution to a rectangular distribution by passing through a cylindrical concave lens A, a cylindrical convex lens B, and horizontal fly-eye lenses C and D. Then, the laser light is passed through the cylindrical convex lenses E and F, reflected by a mirror G (corresponds to the mirror 9 in FIG. 1), converged by a cylindrical lens H, and finally applied to the sample 11.

A description will be made of an example of forming a crystalline silicon film on a glass substrate by illumination with laser light. First, a glass substrate (for example, a Corning 7959 glass substrate) of 10×10 cm$^2$ is prepared. A silicon dioxide film having 2,000 Å in the thickness is formed on the glass substrate by plasma CVD using TEOS as a material. The silicon dioxide film serves as an undercoat film for preventing impurities from being diffused into a semiconductor film from the glass substrate side.

An amorphous silicon film is then deposited by plasma CVD. Although plasma CVD is used in this example, it may be replaced by low-pressure thermal CVD. The thickness of the amorphous silicon film is set at 500 Å, but may apparently be changed as desired. An oxide film is formed on the surface of the amorphous silicon film by immersing the substrate in a mixture solution of hydrogen peroxide and aqueous ammonium at 70° C. for 5 minutes. Further, liquid-phase nickel acetate is applied on the surface of the amorphous silicon film by spin coating. The element Ni facilitates the crystallization of the amorphous silicon film.

Then, hydrogen is removed from the amorphous silicon film by leaving the substrate for 1 hour in a nitrogen atmosphere of 450° C. This is to lower the threshold energy in the later performed crystallizing operation by intentionally forming dangling bonds in the amorphous silicon film. The amorphous silicon film is crystallized by subjecting it to a 4-hour heat treatment of 550° C. in a nitrogen atmosphere. It is due to the effect of the element Ni that the crystallization can be performed at a temperature as low as 550° C.

In the above manner, a crystalline silicon can be formed on the glass substrate. KrF excimer laser light (wavelength: 248 nm; pulse width: 25 ns) is then applied to the crystalline silicon film by using the apparatus shown in FIG. 1. The crystallinity of the silicon film can be improved by this laser light illumination.

The laser beam is reshaped into a rectangular shape by the optics 4 so as to have a beam area of 125 mm×1 mm at the illuminating position. The sample 11 is mounted on the stage 10, and its entire surface is illuminated by moving the stage 10 at 2 mm/s.

As for the conditions of the laser light illumination, the two-step method is employed in which the preliminary illumination is performed at 150 to 250 mJ/cm$^2$ and the main illumination is performed at 200 to 380 mJ/cm$^2$. The number of pulses is set at 30 pulses/s. The two-step illumination method is employed to minimize the deterioration of the uniformity of the film surface which is caused by the laser illumination. The preliminary illumination is effective in maintaining the film uniformity, because the crystalline silicon film added with a nickel salt in the above-described manner includes many amorphous portions and therefore its laser energy absorption factor is much different than polycrystalline silicon. That is, in the two-step illumination method, the amorphous portions remaining in the film are crystallized in the first illumination and the crystallization is facilitated over the entire area in the second illumination. Since these effects of the two-step illumination method are very remarkable, the characteristics of produced semiconductor devices are greatly improved. To further improve the uniformity, the beam scanning direction in the second illumination may be made approximately perpendicular to that in the first illumination.

During the laser light illumination, the substrate temperature is kept at 400° C., to lower the speed of increase and decrease of the substrate surface temperature due to the laser illumination. It is known that in general the uniformity of a substance is lowered by a fast variation in the environment. By keeping the substrate at a high temperature, the deterioration of the uniformity of the substrate surface due to the laser illumination can be minimized.

Although in this embodiment the substrate temperature is set at 200° C., in actually practicing the invention the substrate temperature can be set at an optimum temperature for the laser annealing between 100° C. to 600° C. No atmosphere control is performed; that is, the laser illumination is performed in the air atmosphere.

In general, the stability of the laser output in the preliminary illumination that is performed at a low energy is not good. The light attenuation filters are used to avoid this problem. Specifically, in this embodiment, the four filters having transmittances of 96%, 92%, 85% and 77% are used. By properly combining these filters, a transmittance range of 57% to 96% can be generally covered.

Assume a case where the laser annealing is performed under a condition that the illumination light energy is 200 mJ/cm$^2$ in the preliminary illumination and 300 mJ/cm$^2$ in the main illumination. In this case, in the preliminary illumination, the laser output energy is set at 300 mJ/cm$^2$ and the filters of 85% and 77% are together inserted into the laser light optical path by using the mechanism shown in FIG. 3, to produce a laser beam of 200 mJ/cm$^2$. In the main illumination, the laser illumination is performed with these light attenuation filters removed from the optical path.

It goes without saying that the light attenuation filters are used even in the main illumination when the illumination light energy required in the main illumination is lower than the energy range that allows the laser to operate stably. In such a case, the working efficiency can be increased by the following laser illumination procedure. Assume a case where the energy range that allows a stable laser operation is more than 250 mJ/cm$^2$ and the preliminary illumination and main illumination are performed at 170 mJ/cm$^2$ and 220 mJ/cm$^2$, respectively. In this case, the laser output energy is fixed at 300 mJ/cm$^2$, for instance. The above necessary energy levels can be obtained by using all the four light attenuation filters in the preliminary illumination and the filters of 96% and 77% in the main illumination.

The above description is directed to the case of applying laser beams of different energy levels two times to the same substrate. However, in this embodiment, since the illumination light energy can easily be changed simply by inserting or removing the light attenuation filters into and from the optical path, i.e., without changing the laser output energy, the number of illuminating operations and the illumination light energy can be set arbitrarily for each substrate in a series of laser processing processes. This enables substrates on which different kinds of films are formed to be processed en bloc.

For example, the stage 10 of the laser illumination apparatus shown in FIG. 1 is reciprocated during the laser illumination to thereby apply laser light to the same substrate a plurality of times. In this operation, the laser output energy is fixed, and the illumination light energy is adjusted for each laser illumination by properly inserting or removing the light attenuation filters into and from the laser light optical path while the stage 10 goes or returns. If the stage 10 is rotated approximately by 90° at least once when the laser light scanning direction is changed from the go direction to the return direction or vice versa (i.e., if the beam scanning direction with respect to the substrate is changed), the uniformity of a film can further be improved.

According to the invention, the laser output energy can always be kept constant during the laser processing. As described above, in general, when the output energy of a laser is changed, certain time is required for the output energy to become stable. In contrast, since the invention eliminates the need of changing the laser output energy, the time for stabilizing the laser output energy can be saved. This advantage is very effective in improving the working efficiency and reducing the cost particularly in mass-production.

Embodiment 2

This embodiment is directed to a method in which the laser processing technique of the first embodiment for a silicon film or a silicon compound film is performed by an industrial machine suitable for mass-production (multiple chambers are used and a substrate is conveyed by a robot arm), and atmosphere control is performed on substrates during the laser illumination to improve a uniformity variation among substrates.

Figure 4:
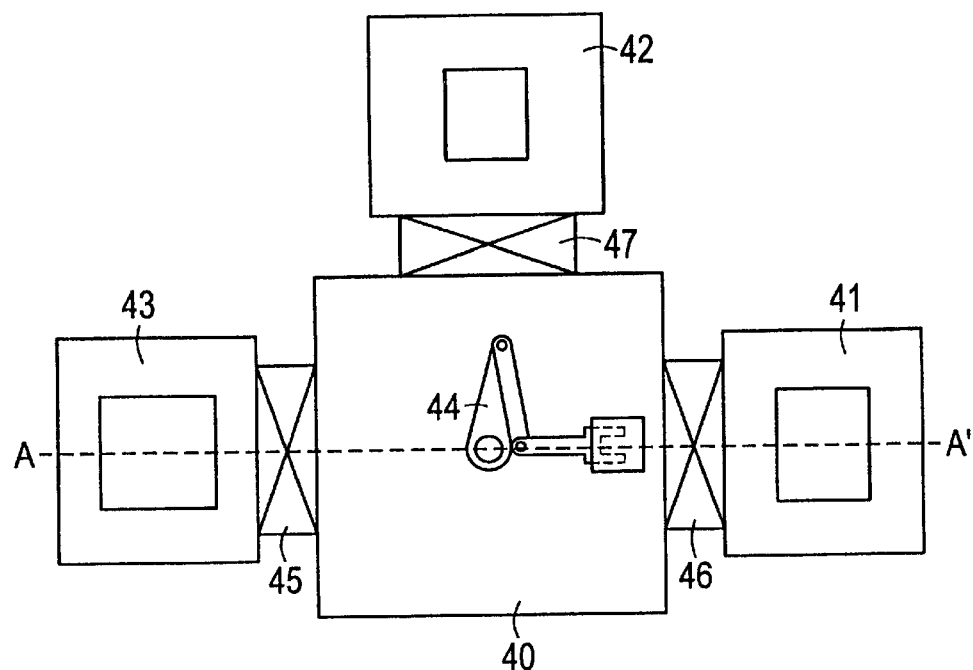
FIG. 4 is a top view of a systematized laser processing apparatus.
Figure 5:
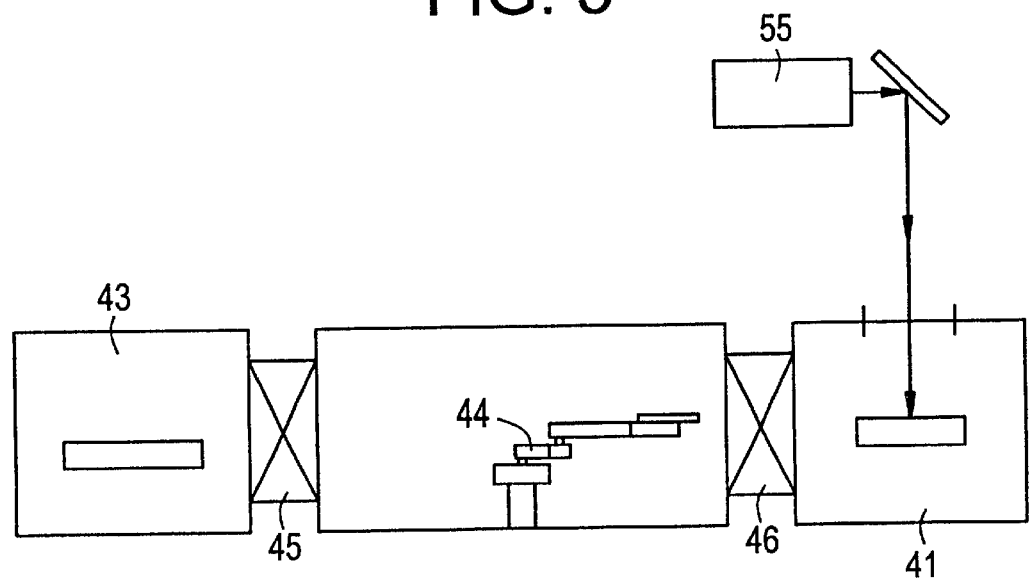
FIG. 5 is a sectional view of the systematized laser processing apparatus.

First, an apparatus will be described briefly. FIG. 4 is a schematic top view of the apparatus, and FIG. 5 is a schematic sectional view taken along line A–A' in FIG. 4. Reference numeral 41 denotes a laser illumination chamber. To keep a substrate at a prescribed temperature during the laser illumination, a heater is embedded under a position where the substrate is to be placed. Reference numeral 42 denotes a chamber where a hot plate for heating a substrate is disposed. Reference numeral 43 denotes a chamber where a substrate is stored before the laser illumination. A substrate is brought into or carried out of the apparatus through the chamber 43.

A robot arm 44 for conveying a substrate, which is installed in a central chamber 40, is used to move a substrate between the chambers 41 to 43. Each chamber is so designed as to be airtight, i.e., as to enable atmosphere control. Gate valves 45 to 47 are provided to separate the chambers 40 to 43 from each other. By closing the gate valves 45 to 47, atmospheres in the respective chambers 40 to 43 can be prevented from being mixed with each other. Evacuators are provided in the respective chambers 40 to 43 to keep those chambers at necessary pressures by evacuation. In particular, if the laser illumination chamber 41 is so designed as to be evacuated to a vacuum and the laser illumination is performed in a vacuum, a variation in film quality among substrates can be suppressed.

The laser processing in a vacuum is superior in reproduction performance, because the processing is not affected by a gas around the substrate. Alternatively, the inside of the laser illumination chamber 41 may always be rendered in a fixed atmosphere to provide high reproduction performance. This method provides equivalent effect to that obtained by the laser illumination in a vacuum. This effect is useful for suppressing a variation among products and increasing their reliability particularly in mass-production. For example, a laser illumination apparatus 55 has a configuration as shown in FIG. 1. To obtain necessary light attenuation, the laser illumination apparatus 55 incorporates the light attenuation filter mechanism as shown in FIG. 3.

Next, a description will be made on how to use the above apparatus. First, substrates on which a thin film to be illuminated with laser light is deposited are brought into the chamber 43 shown in FIGS. 4 and 5. A plurality of substrates held by a cartridge are brought into the chamber 43 at the same time. Then, all of the four chambers 40 to 43 are evacuated. Subsequently, the gate valves 45 and 47 are opened and substrates are brought into the chamber 42 one by one by the robot arm 44 that is installed in the chamber 40. The substrates brought into the chamber 42 are placed on the hot plate and heated to a prescribed temperature. Closing the gate valve 47 during this operation is preferable in terms of contamination with impurities but disadvantageous in terms of productivity. Whether to close the gate valve 47 or not may be determined properly in actual practice.

The substrates are heated to 200° C. After the substrates are heated sufficiently, the substrates are moved into the chamber 41 by the robot arm 44, where the substrate are illuminated with laser light in the manner described in the first embodiment.

If the laser illumination is performed in the manner described in the first embodiment, it takes a little more than 100 seconds. It takes about 3 minutes for the substrates to be sufficiently heated in the chamber 42. Therefore, the laser illumination can be performed more efficiently by allowing the substrates of a number that is two times the number of substrates that can be laser-illuminated at one time to be heated in the chamber 42. That is, an even number of substrates are heated in advance in the chamber 42, and substrates of half of that number are brought into the laser illumination chamber 41 by the robot arm 44. New substrates are brought from the chamber 43 into the chamber 42 by the robot arm 44 during the laser illumination. Upon completion of the laser illumination, the laser-processed substrates are returned to the chamber 43 by the robot arm 44. Further, the substrates that have been stored in the chamber 42 before the replenishment are taken out of the chamber 42 and brought into the chamber 41 by the robot arm 44. By repeating the above operations continuously, the time required for heating the substrates before the laser illumination can be saved.

That is, in contrast to the fact that conventionally one laser processing operation takes about 5 minutes (3 minutes for the substrate heating plus 100 seconds for the laser illumination), the processing time can be reduced to less than half of the above time by using the above-described apparatus. Further, the laser annealing can be performed continuously in a clean atmosphere (including a vacuum state).

The laser illumination technique of the invention can not only greatly improve the productivity, but also improve the uniformity of a film to become semiconductor devices. The invention can be applied to all the laser processing processes that are used in semiconductor device manufacturing processes. In particular, where the semiconductor devices are TFTs, to improve the uniformity of threshold voltages of the TFTs, the invention is effectively applied to the process of illuminating a polycrystalline silicon film as described in the embodiment. Further, to improve the field-effect mobility of TFTs or the uniformity of on-currents, it is effective to apply the invention to the process of activating impurity elements of the source and drain in addition to the above process. As such, the invention is believed to be industrially useful.

As an example of the attenuation filter usable in the embodiment of the present invention, a synthetic quartz plate having a laminate coating of a hafnium oxide layer and a silicon dioxide layer in turn can be used. The number of the coatings should be determined depending upon the desired transmissivity of the filter.

What is claimed is:

1. A method for manufacturing a semiconductor device comprising the steps of:

providing a laser apparatus having an oscillator, a homogenizer and at least one light attenuating filter;

emitting a laser beam from said oscillator; and irradiating said laser beam to a semiconductor film formed over a substrate to crystallize said semiconductor film;

wherein said at least one light attenuating filter is inserted between said oscillator and said homogenizer on an optical path when an energy of said laser beam applied to said semiconductor film is lower than an output energy range that allows said oscillator to operate most stably.

2. A method according to claim 1, wherein said oscillator is a pulse-oscillator.

3. A method according to claim 1, wherein said laser beam is an excimer laser beam.

4. A method according to claim 1, wherein said energy of said laser beam applied to said semiconductor film is 150–250 mJ/cm$^2$.

5. A method for manufacturing a semiconductor device comprising the steps of:
providing a laser apparatus having an oscillator, a homogenizer and at least one light attenuating filter;
emitting a first laser beam from said oscillator;
irradiating said first laser beam to a semiconductor film formed over a substrate to crystallize said semiconductor film;
emitting a second laser beam from said oscillator; and
irradiating said second laser beam to the crystallized semiconductor film;
wherein said at least one light attenuating filter is inserted between said oscillator and said homogenizer on an optical path when an energy of said first laser beam applied to said semiconductor film is lower than an output energy range that allows said oscillator to operate most stably.

6. A method according to claim 5, wherein said oscillator is a pulse-oscillator.

7. A method according to claim 5, wherein said first laser beam is an excimer laser beam.

8. A method according to claim 5, wherein said energy of said first laser beam applied to said semiconductor film is 150–250 mJ/cm$^2$.

9. A method for manufacturing a semiconductor device comprising the steps of:
providing a laser apparatus having an oscillator, a homogenizer and at least one light attenuating filter;
emitting a first laser beam from said oscillator;
irradiating said first laser beam through said at least one light attenuating filter, which is inserted between said oscillator and said homogenizer on an optical path, to a semiconductor film formed over a substrate to crystallize said semiconductor film;
emitting a second laser beam from said oscillator; and
irradiating said second laser beam to the crystallized semiconductor film;
wherein a first energy of said first laser beam applied to said semiconductor film is lower than an output energy range that allows said oscillator to operate most stably, and
wherein a second energy of said second laser beam applied to said crystallized semiconductor film is higher than said first energy of said first laser beam.

10. A method according to claim 9, wherein said oscillator is a pulse-oscillator.

11. A method according to claim 9, wherein said first laser beam is an excimer laser beam.

12. A method according to claim 9, wherein said first energy of said first laser beam is 150–250 mJ/cm$^2$.

13. A method for manufacturing a semiconductor device comprising the steps of:
providing a laser apparatus having an oscillator, a homogenizer and at least one light attenuating filter;
emitting a laser beam from said oscillator; and
irradiating said laser beam to a semiconductor film formed over a substrate to crystallize said semiconductor film;
wherein said at least one light attenuating filter is inserted between said oscillator and said homogenizer when an energy of said laser beam applied to said semiconductor film is lower than an output energy range that allows said oscillator to operate most stably, and
wherein said laser beam has a cross section elongated in one direction on a surface of said semiconductor film.

14. A method according to claim 13, wherein said oscillator is a pulse-oscillator.

15. A method according to claim 13, wherein said laser beam is an excimer laser beam.

16. A method according to claim 13, wherein said energy of said laser beam applied to said semiconductor film is 150–250 mJ/cm$^2$.

17. A method for manufacturing a semiconductor device comprising the steps of:
providing a laser apparatus having an oscillator, a homogenizer and at least one light attenuating filter;
emitting a first laser beam from said oscillator;
irradiating said first laser beam through said at least one light attenuating filter, which is inserted between said oscillator and said homogenizer on an optical path, to a semiconductor film formed over a substrate to crystallize said semiconductor film;
emitting a second laser beam from said oscillator; and
irradiating said second laser beam to the crystallized semiconductor film;
wherein an energy of said first laser beam applied to said semiconductor film is lower than an output energy range that allows said oscillator to operate most stably, and
wherein each of said first and second laser beams has a cross section elongated in one direction on a surface of said semiconductor film.

18. A method according to claim 17, wherein said oscillator is a pulse-oscillator.

19. A method according to claim 17, wherein said first laser beam is an excimer laser beam.

20. A method according to claim 17, wherein said energy of said first laser beam applied to said semiconductor film is 150–250 mJ/cm$^2$.

21. A method for manufacturing a semiconductor device comprising the steps of:
providing a laser apparatus having an oscillator, a homogenizer and at least one light attenuating filter;
emitting a first laser beam from said oscillator;
irradiating said first laser beam through said at least one light attenuating filter, which is inserted between said oscillator and said homogenizer on an optical path, to a semiconductor film formed over a substrate to crystallize said semiconductor film;

emitting a second laser beam from said oscillator; and irradiating said second laser beam to the crystallized semiconductor film;

wherein a first energy of said first laser beam applied to said semiconductor film is lower than an output energy range that allows said oscillator to operate most stably, wherein a second energy of said second laser beam applied to said crystallized semiconductor film is higher than said first energy of said first laser beam, and wherein each of said first and second laser beams has a cross section elongated in one direction on a surface of said semiconductor film.

22. A method according to claim 21, wherein said oscillator is a pulse-oscillator.

23. A method according to claim 21, wherein said first laser beam is an excimer laser beam.

24. A method according to claim 21, wherein said first energy of said first laser beam is 150–250 mJ/cm$^2$.

* * * * *